United States Patent [19]

Rebsch

[11] 4,299,304

[45] Nov. 10, 1981

[54] EXPONENTIAL FOLDED HORN SPEAKER ENCLOSURE

[76] Inventor: Gary A. Rebsch, 14016 Shippers La., Rockville, Md. 20853

[21] Appl. No.: 162,929

[22] Filed: Jul. 1, 1980

[51] Int. Cl.[3] .......................... H05K 5/00; G10K 11/00

[52] U.S. Cl. .......................... 181/144; 181/182; 181/184; 181/188; 181/199

[58] Field of Search .............. 181/144, 145, 152-156, 181/159, 147, 199, 182, 184, 188; 179/115.5 PS, 116, 115.5 H

[56] References Cited

U.S. PATENT DOCUMENTS

| | | | |
|---|---|---|---|
| 2,146,325 | 2/1939 | Allison | 181/188 |
| 2,224,919 | 12/1940 | Olson | 181/152 |
| 2,310,243 | 2/1943 | Klipsch | 181/152 |
| 2,878,887 | 3/1959 | Potter . | |
| 3,326,321 | 6/1967 | Valuch | 181/144 |
| 3,923,124 | 12/1975 | Hancock | 181/156 |
| 4,083,426 | 4/1978 | Peugh | 181/156 |
| 4,146,111 | 3/1979 | Mae et al. | 181/154 |
| 4,173,266 | 11/1979 | Pizer et al. | 181/156 |

*Primary Examiner*—Lawrence R. Franklin
*Assistant Examiner*—Benjamin R. Fuller

[57] ABSTRACT

An exponential folded horn loudspeaker enclosure is built so that all of its components are coaxial with respect to a line that is equidistant from three cooperating surfaces, including floor or ceiling, as well as the customary two walls of a corner. Perfect symmetry with all three cooperating surfaces permits a smooth transition to these surfaces, so that they become a balanced extension of the exponential horn, more than doubling its effective length. Approaching the configuration of a large ideal horn, this geometry is uniquely free of discontinuities and artificial resonances that are needed in other enclosures for boosting low frequency response; therefore, efficiency and fidelity of low frequency response are greatly increased over other enclosures of comparable size.

10 Claims, 6 Drawing Figures

EXPONENTIAL FOLDED HORN SPEAKER ENCLOSURE

This invention relates to loudspeaker systems, in particular to an exponential folded horn loudspeaker enclosure for mounting in a floor or ceiling corner of a room. This efficient impedance matching device approaches the symmetry and continuity of an ideal propagating horn, but in a compact size that was inconceivable previous to this design. It is simple and inexpensive to manufacture, and economical in its requirements for electricity and floor space.

Several speaker (i.e., loudspeaker) enclosures using the corner floor or ceiling as a sound wave propagation means are known to the prior art, but none of them has applied the principle of the exponential folded horn. The exponential horn has been recognized from the earliest days of audio engineering as the ideal device for matching the speaker diaphragm to the listening area. And bending or "folding" of the horn, while causing negligible distortion and attenuation of bass frequencies, reduces it to a compact size suitable for small living areas.

Accordingly, the prime object of the present invention is to increase the efficiency and quality of sound reproduction by providing an exponentially expanding horn structure, the mouth of which ingeniously adapts to the corner floor or ceiling as an extension of its own geometry, thereby more than doubling its effective throat length, and making the smoothest possible transition from the speaker to the room.

Another object of this invention is to permit operation of audio equipment at lower power levels for the same level of sound output. Higher efficiency and absence of resonance enable the amplifier and speaker components to be run at lower power levels, which not only lowers the distortion contributed by these components, but also saves electricity in an energy impoverished world.

Another object of this invention is to use residential floor space more effectively and minimize resonance problems inherent in rectangular systems. Corner space is regarded as least accessible for use of furniture. The floor-mounted option will use this less desirable corner space; a ceiling-mounted option will not use any floor space at all, in that furniture can still be placed below it. Ceiling mounts have the advantage that the cooperating walls serving as an extension of the horn are sure to present fewer obstructions, permitting uninterrupted dispersion of low frequencies, and more direct radiation of the highs. In addition, launching the sound waves diagonally with respect to the walls reduces standing wave resonance.

Another object is to exploit simplicity, rigidity, and economy of triangular and cylindrical construction. The preferred embodiment comprises only four parts. Furthermore, the enclosure is perfectly symmetrical with respect to each of the three corner walls, having no discontinuities (other than the three coaxial foldings of the horn duct) to cause diffractions of the sound waves.

It has recently been found that the foregoing objects and other benefits are achieved in this new invention, a combination of two acoustic radiators that have apparently never before been used together: (1) the floor- or ceiling-corner of a room and (2) the exponential folded horn.

A speaker mounted flat against the center of a wall effectively doubles its efficiency when it is moved to a spot adjacent to a corner, because the perpendicular wall gives it a refelction (virtual source), in addition to its real source. Very few speaker enclosures however, have gone a step further and moved up or down to the ceiling or floor, where the third perpendicular surface reflects both real and virtual image, to yield a net effect of four speakers (see U.S. Pat. Nos. 4,083,426, 3,964,571 and 3,379,276).

Another explanation of this effect is in consideration of the decreasing spherical volume that must be covered by a wavefront in these three geometries; a speaker radiates into half-space when in the center of a wall, into quarter-space when in a corner and into eighth-space when in a floor-corner; this eighth-space can be cut in half two more times to yield a 45° horn shape and even more efficiency.

The exponential horn is an illustration of a related fact, that the impedance match of a small wavefront to a large one can best be accomplished by a gradual tapering of a small cross section to a large one. Innumerable examples can be given, from earhorns and the conical horn that made the unamplified vibration of Edison's first phonographs more audible, to the sophisticated exponential horns of today's public address speakers and high fidelity tweeters. The fact that horns can be folded or coiled without any degradation of sound quality enabled musicians centuries ago to make their instruments transportable and useful in small areas. The coiled automobile horn is a modern exponential folded horn.

Exponential folded horn speaker enclosures designed for the corner of a room are common, but every known example uses only the two walls as cooperating surfaces (U.S. Pat. Nos. 4,173,266, 3,923,124, 2,310,243 and 2,224,919), so the horn duct is symmetrical with only two surfaces. The floor, instead of being a cooperating surface inevitably becomes an interfering surface, causing distortion and unwanted resonance.

In contrast to existing designs, the new design is coaxial about a Center Line that extends from the corner point of the three cooperating wall surfaces out into the center of the room, being equidistant from each of the three surfaces along its total length. The Center Line is defined by this corner point and the center point of an equilateral triangle placed in this corner, its three edges flush with the three surfaces. This triangle forms the base of the enclosure. All enclosure walls and speakers are coaxial with respect to the Center Line, and therefore in perfect symmetry with all three wall surfaces.

The effective geometry of the invention can be visualized by imagining a large exponential horn, shaped like that of a mid-range speaker or tweeter but with an equilateral triangle cross section, its throat on the Center Line and its mouth placed close to the equilateral triangle in the corner as described above. A sound wave traveling from the throat to the mouth advances to the triangle and is reflected by it. The triangle can then be thought of as a diaphragm in the throat of a room-sized extension horn that guides the advancing sound wave into the room at a rate of increasing cross section comparable to that of the horn. This visualization is completed by "folding" the exponential horn back on itself twice, so that it does not protrude significantly into the usable living space of the room. U.S. Pat. No. 2,878,887 shows soundwaves being launched by reflection of a horn from a corner-mounted triangle, but it is an isosceles triangle, and neither symmetric, continuous nor compact.

The most important advantage of this enclosure over previous enclosures is that the design contains no significant discontinuities to cause audible resonances, while at the same time it launches all low frequency waves with the greatest possible efficiency. The inner design is of three parallel channels beginning at the back of the first speaker and increasing in area at a steadily rising rate. Each of the three stages ends with a reflection, which is a minimal discontinuity for low frequencies. The wavefront experiences an area-increase discontinuity as it finally leaves the anterior wall of the enclosure, but there is not another disturbance until 1 to 2 meters later when it hits the ceiling or floor, which is also a minor discontinuity, as will be shown hereafter. The fixed geometry of the corner would be impractical to adjust, but the tapering rate of the folded horn can be set over a wide range of values in the new design, to match a wide range of speaker impedances.

This smoothly guided propagation path through effectively 4 to 8 meters of horn duct is in marked contrast to the common speaker cabinet that dumps the soundwaves directly through the speaker mounting hole or a tiny port (containing a resonance already designed into the cabinet for artificially boosting bass response) into the half-space of a room; the soundwaves then reflect from the opposite wall of the room, to form another resonance. Even the existing folded horn enclosures have resonances because of the complex discontinuous duct path in the inner design, in addition to the aforesaid floor interference. Their wavefronts are almost always launched from a side duct in an irregularly shaped resonant chamber that houses the speaker, instead of being launched directly from the diaphragm, axially into the horn throat, as in the new invention.

In addition to the horn structure, there is another unique capability present in this invention, that of a second speaker or diaphragm to cooperate with or reinforce the first speaker. It offers several options, each of which is an innovative application of previous concepts. U.S. Pat. No. 4,146,111 and many other sources have used an "idler" diaphragm in a box type enclosure, usually mounted in a position symmetrical with the first speaker, as a means of reciprocally matching the first speaker output. U.S. Pat. No. 4,008,374 uses two identical speakers energized in phase, one in the normal front position of the box, and one in the middle, backed by an infinite baffle.

The original objective was to modify the latter invention to generate a "piston of air" for driving the throat of the horn. The new invention is ideally suited for this modification; the second speaker can easily be mounted in the posterior wall directly behind the first speaker at the first reflection or folding of the horn duct. As asserted by the two Patents just cited, a better impedance match is obtained from a cooperating surface than from a rigid reflecting wall, whether it is powered or idling. If two speakers are so used, Stage I, the cylindrical volume of air between them, becomes an air piston impinging on the center of the second speaker, whose edges in turn feed Stage II.

Further objects and advantages of the present invention will be apparent in the following specification, appended claims, and accompanying drawings, in which:

Figure 1:
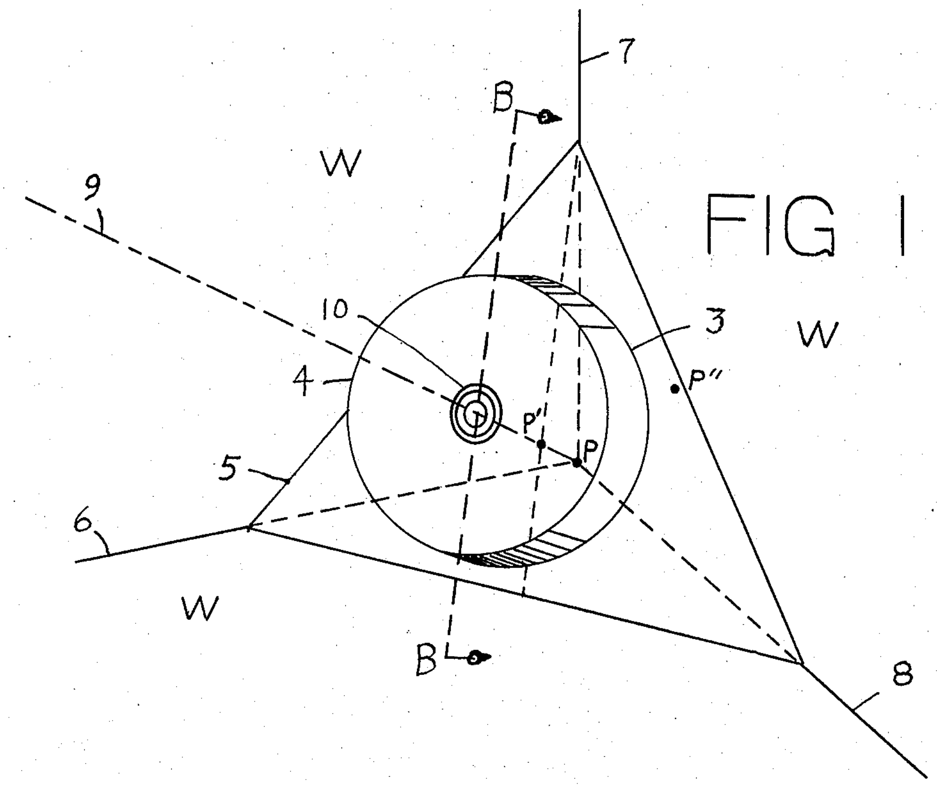
FIG. 1 is a perspective view of the invention mounted in a floor-corner of a room.

FIG. 1 shows a first embodiment of the present invention. Numerals in this figure appear in other figures to indicate corresponding, but not identical features of other embodiments. The posterior wall 5, a planar equilateral triangle typically made of plywood, is mounted in a floor- or ceiling-corner of a room. Its edges are flush with the three cooperating surfaces W, the corner walls plus a floor or ceiling, referred to by the same symbol to emphasize their equality as far as the enclosure is concerned.

Conical sidewall 3, truncated by anterior wall 4, terminates at a fixed distance from the front face of posterior wall 5 to form an exit port, and is coaxial with Center Line 9. Center Line 9 is defined by corner P and the geometric center P′ of posterior wall 5, so that any point along its length is at an equal distance from each cooperating surface W. Therefore, any circular object that is mounted coaxially with this line, such as speaker 10, anterior wall 4, and sidewall 3, will be symmetrical with all three cooperating surfaces W, and a soundwave exiting the output port between sidewall 3 and posterior wall 5 will experience an identical geometrical configuration at each surface.

Figure 2:
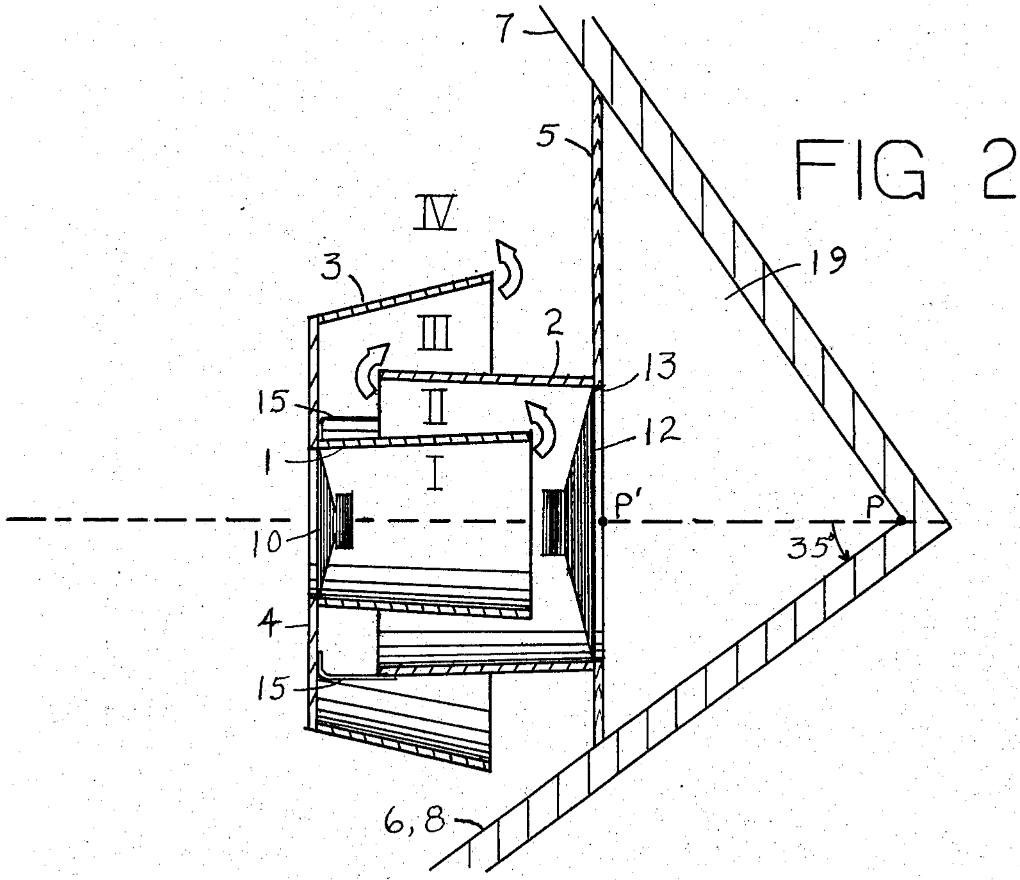
FIG. 2 is a cutaway view in plane B—B of FIG. 1, tilted forward 35° for clarity of dimensions.
Figure 3:
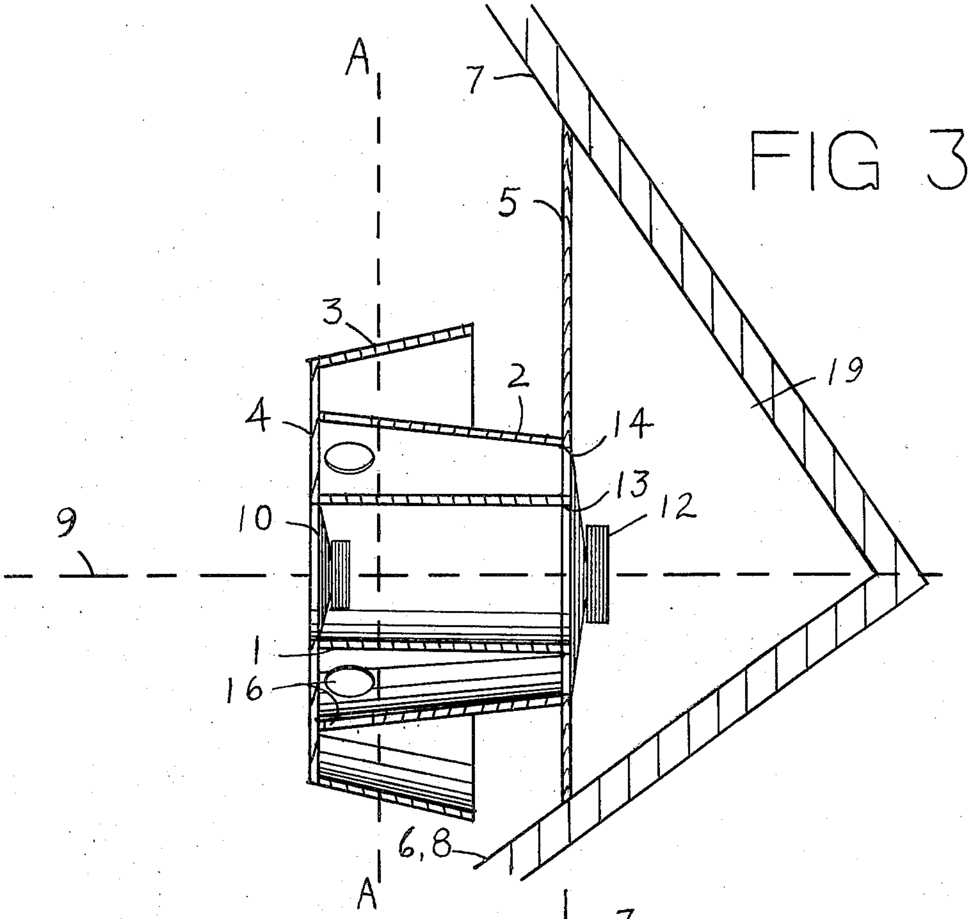
FIG. 3 is a second embodiment in a cutaway view.
Figure 4:
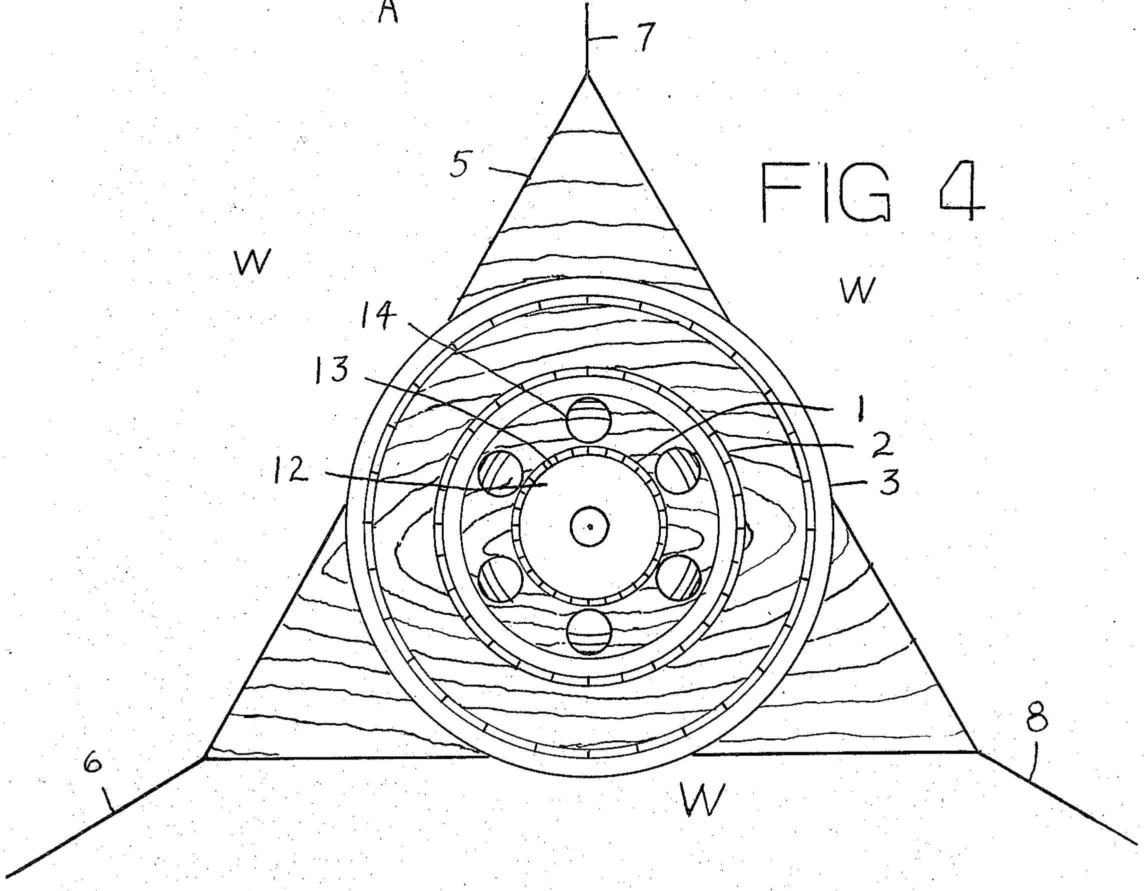
FIG. 4 is a cutaway view in plane A—A of FIG. 3.
Figure 5:
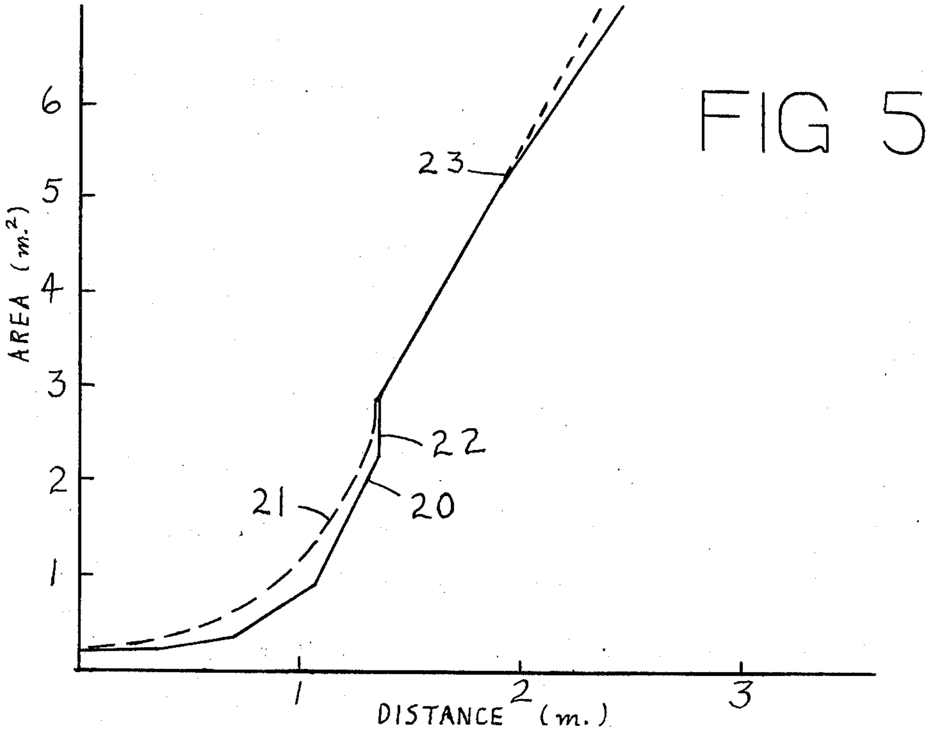
FIG. 5 is a graph of (a) horn cross sectional area as a function of distance from the throat opening, and (b) an ideal exponential curve.

FIGS. 2, 3 and 5 are misleading at first glance as to the perfect symmetry of the enclosure. They show the dimensions of the posterior wall 5 to be twice as great above the Center Line as below it because corners 6 and 8 are here superimposed in the plane of the floor, on which the bottom edge and two corners of the triangle rest, whereas corner 7 represents only the juncture line of the two walls that is touched by the other point of the triangle. The fact that the cylindrical assembly is symmetrical with respect to the walls W is more apparent in FIG. 4.

FIG. 2 shows the interior cross section of the new invention, tilted 35° for dimensional clarity, so that the Center Line 9 appears as a horizontal reference line, since all enclosure components are coaxial with respect to it. The method of operation is as follows: soundwaves excited by the rear of the first speaker 10 travel through conical Stage I (contained by sidewall 1), to reflect from posterior wall 5 into coaxial Stage II (contained by sidewall 2), to reflect from anterior wall 4 into coaxial Stage III (contained by sidewall 3), to reflect from posterior wall 5 and exit the enclosure into Stage IV, the space between sidewall 3 and cooperating surfaces W. The three reflections, or foldings, are indicated by the bent arrows. The wavefront occupies a circular area in Stage I and a coaxial, or donut-shaped, area in Stages II and III. The design provides for an increase of cross sectional area at an exponential rate as the sound wave travels through this folded horn duct. It can therefore be seen that the objective of perfect symmetry and continuously expanding cross sectional area has been achieved.

The three sidewalls are preferably conical, but sidewall 2 can be cylindrical for convenience and strength of construction, since it is usually a support wall for anterior wall 4; this would, however, give stage II the same rate of area increase as Stage I. Sidewalls 1, 2 and 3 are most practically made of rigid plastic or metal. The conical or cylindrical shape lends compactness to the first two stages, but an optional triangular format (not shown) can be chosen for sidewall 3; the transition to triangular cross section is inevitable, in any case, because of the triangular space between the three cooperating walls.

If speaker port 13 is not cut in posterior wall 5, a simple horn duct results. But if speaker port 13 is cut out, a second speaker 12 can be placed behind it for operation in electrical phase with first speaker 10, or in front of it for operation in opposite phase. The space between speakers, Stage I, becomes a "piston of air" that feeds the horn throat. The space behind posterior wall 5 then becomes a secondary enclosure 19; it should be lined with acoustic absorbent material, as is commonly done with infinite baffle enclosures. Acoustic material should also be placed judiciously throughout the horn duct to attenuate high frequencies and prevent wall vibration. Triangle edges are cut at an approximate 35° angle for a flush fit to the walls W, and foam rubber edging can assist in obtaining an air tight fit. Volume of this pyramid is given by: Volume=$(\frac{1}{3})$ base area×height.

FIG. 3 shows a second embodiment, for which second speaker 12 is no longer optional, but required. Stage I does not communicate directly with Stage II because sidewall 1 is continuous and substantially air tight between anterior wall 4 and posterior wall 5. Communication can be made in at least two ways, (1) via the front of speaker 12's cone when it covers both ports 13 and 14, or (2) via the back of a smaller speaker's cone (not shown) when it covers port 13 only. A simple speaker cone diaphragm can be substituted for a speaker on posterior wall 5, with the significant advantage that phase interference at higher frequencies is avoided. There may also be theoretical reasons for placing idler diaphragms in ports 14 between Stages II and III.

The secondary enclosure in case (2), bounded by posterior wall 5 and the three cooperating walls W, becomes a direct part of the horn duct, which makes it more significant than when it merely served as an infinite baffle for case (1). As such it can be used as a tuning device for the audio response curve.

Options for using this concept have been tried in experimental enclosures, but few firm conclusions have yet been reached as to relative worth, other than on theoretical and structural desirability. An extensive program of measurement, analysis and manufacturing technology will indicate the option that will best embody the invention; embodiments described herein should not be construed as limiting the invention as appearing in the claims.

Since first sidewall 1 has no ports in this second embodiment, it may be strong enough to support anterior wall 4. But second sidewall 2 will normally serve as support means (both support means are shown in FIG. 3). Its communication means with Stage III can take the form of holes 16 as close as possible to anterior wall 4. Another method is to terminate sidewall 2 at a predetermined distance from anterior wall 4 and extend struts 15 (see FIG. 2) therebetween. The former method may be an easier construction, but the latter is preferred as better preserving symmetry in the horn.

FIG. 4 shows ports 13 and 14 with the coaxial mounting of component parts. The optimum configuration of the enclosure may include a triangular third sidewall (not shown), rather than the circular one 3. The inevitable transition from circular to triangular cross section can be made then in a tapered fashion, beginning at anterior wall 4 instead of abruptly at posterior wall 5. Sharply pointed isosceles triangle baffles (not shown) can be placed across each of the three corners of the triangle, giving it a hexagonal cross section at the anterior wall, tapering to the full triangle at the open end of sidewall 3. A triangular anterior wall and sidewall 3 of wood lends a pleasing appearance to the system. The sidewalls and anterior wall enclosing the deadspace left by the baffles can be eliminated to lessen the wavefront discontinuity 22 at the end of Stage IV, or one corner can be left to mount a tweeter.

The first speaker ideally should be a two section coaxial type, so that the highest frequencies do not enter the horn throat. The second speaker should be a woofer with a low cutoff, so that the air piston operates substantially below 1500 Herz. If the distance between speakers is reduced to 15 cm, as in FIG. 6, no significant phase cancellation will occur.

Present designs maintain a fixed rate of area increase through each stage, with stepwise exponential changes between stages, as shown by curve 20 in FIG. 5, a plot of horn cross sectional area as a function of distance from the first speaker. The discontinuity at 22 results from wavefront spillover into the area in front of the anterior wall as the wave exits Stage IV; it is a 10 to 40% area increase, depending on the design. At 23, less than a meter farther, the floor or ceiling begins to subtract from the expansion rate of the three cooperating walls, but this subtraction is surprisingly slight. It is such a gradual taper that at 3 meters, it cuts the cross section by less than 15%.

Figure 6:
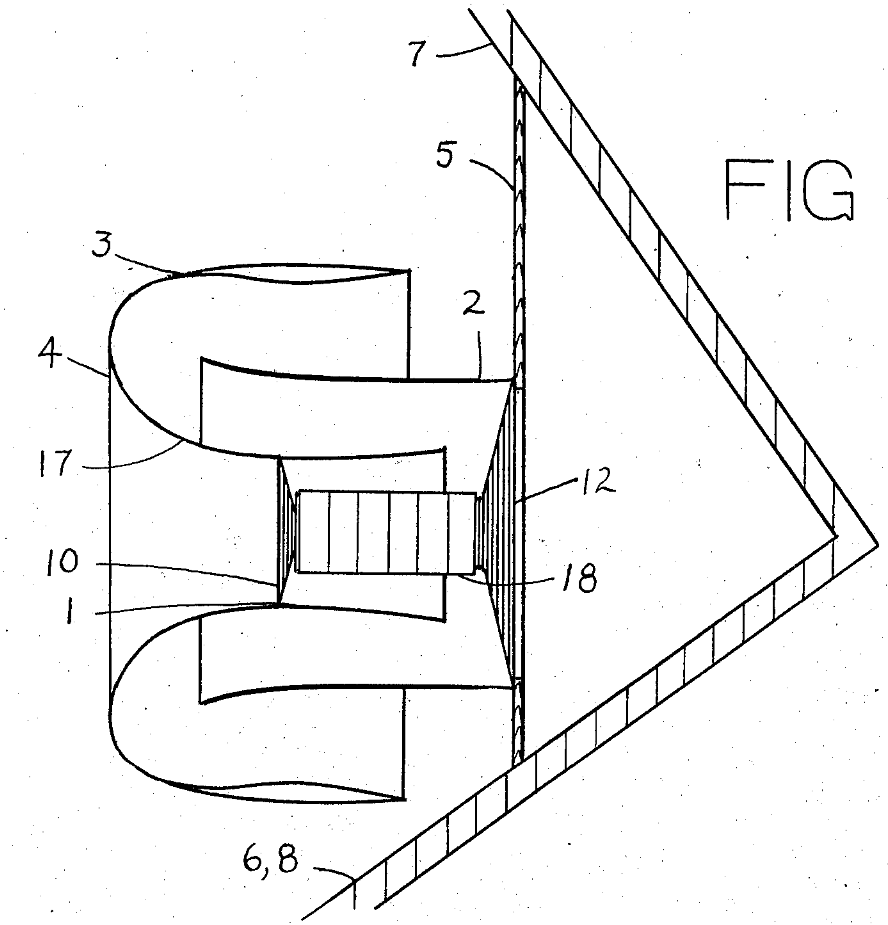
FIG. 6 is a cutaway view of a projected ultimate embodiment.

The ideal exponential curve 21 is approached by the design of FIG. 6, a visualization of the ultimate embodiment. It could be made of approximately five pieces of molded plastic and assembled by any method that would result in substantially airtight junctions. The third sidewall could even incorporate the circular-to-triangular transition described above, and the smoothness of the horn duct could be optimized by computer-aided-design.

The toroidal anterior wall and the recessed first speaker allow for a short outer horn 17, decreasing phase difference between the two speakers. If the second speaker 12 is mounted in front of posterior wall 5, phase difference is decreased still more. A cylinder 18 can cover the magnet coil assemblies and eliminate the discontinuities they cause in the air piston.

Substantial means should be used to support the enclosure solidly if the ceiling mount option is chosen. A recommended means that will not damage walls is two boards or slats of cross section about 3% by 8% of the edge of posterior wall 5, and length 5% greater than the distance from wall-center-edge point P" to the floor. If one end of each is hinged or pivoted at point P" and a corresponding point on the other wall edge of posterior wall 5, the enclosure can be positioned in the corner with the slats adjacent to the walls; the slats can shoringly support the enclosure momentarily while their lower ends are attached by screws to the floor molding. Attachment may be unnecessary in wall-to-wall carpet rooms, where they can be simply wedged toward the corner.

This specification has described a new type of exponential folded horn enclosure whose horn duct ingeniously produces the equivalent shape of an exponential horn structure in a small volume of convenient configuration, uniquely suited for home use. Experimental models indicate that the assembly does indeed reproduce a clear bass spectrum down to the lowest audible frequencies, as if it had come from a large exponential horn. Recommended minimum size, based on these models, is about 80 cm for an edge of posterior wall 5; this is mainly due to speaker capabilities at low frequencies which dictate a 20 cm first speaker and a 30 cm second speaker as a minimum size.

An enclosure of this dimension would typically have a horn duct length of nearly 2 meters through its four stages. The cooperating surfaces add at least another 2 meters, to yield a total length of 4 meters, suggesting support for the lowest organ pipe frequencies, that have their quarter-wavelengths in this region.

I claim:

1. A folded horn loudspeaker enclosure comprising planar anterior and posterior walls, and first, second and third conical encircling sidewalls, said sidewalls being mounted coaxially alternately on said anterior and posterior walls, enclosing first, second and third consecutive stages of exponentially increasing cross sectional area, said posterior wall shaped as a planar equilateral triangle, forming a substantially airtight secondary enclosure when placed into contact with the three mutually perpendicular cooperating surfaces of a floor or ceiling corner of a room, and supporting said second sidewall, the geometric center point of said posterior wall and the common point of said three mutually perpendicular cooperating surfaces defining a Center Line, with which all enclosure walls are coaxial, in absolute symmetry with each of the three cooperating surfaces, said anterior wall shaped as a circular disc and supporting said first and third sidewalls, said first encircling sidewall shaped as a truncated cone, the larger end forming a communicating port to the second stage at the posterior wall, the smaller end enclosing the first loudspeaker and mounting over a circular loudspeaker hole coaxial with the Center Line on said anterior wall, permitting free communication of said loudspeaker with the air inside and outside said folded horn enclosure, said second encircling sidewall shaped as a truncated cone of larger diameter than said first sidewall, the larger end forming a communicating port to the third stage at said anterior wall, the smaller end mounted coaxially with the Center Line on said posterior wall, said third encircling sidewall shaped as a truncated cone of larger diameter than said second sidewall, the larger end forming a communicating port to said three cooperating surfaces, the smaller end mounted to the edge of said anterior wall, said three coaxial sidewalls enclosing within and between themselves a cross sectional area that continuously expands with distance from the first loudspeaker, communicating through first, second and third stages in exponentially increasing sequence, thereafter communicating with the cooperating surfaces to form a fourth stage of a large exponential horn.

2. The enclosure of claim 1 in which a second loudspeaker, of equal or larger diameter than said first loudspeaker, but smaller than or equal to the diameter of said second sidewall, is mounted coaxially on the Center Line and behind a hole in said posterior wall, driven in phase electrically with said first loudspeaker.

3. The enclosure of claim 1 in which said second speaker is mounted coaxially on said Center Line and in front of a hole in said posterior wall, driven in opposing electric phase with said first loudspeaker.

4. The enclosure of claim 1, 2 or 3 in which said anterior wall assembly is supported from said posterior wall by said second sidewall, by means of struts extending through the communicating port structure.

5. The enclosure of claim 1, 2 or 3 in which said anterior wall assembly is supported from said posterior wall by means of an unported first sidewall, communication between said first and second stages being made through ports in said posterior wall through a secondary enclosure formed by the posterior wall and said three cooperating surfaces.

6. The enclosure of claim 5 in which said second loudspeaker covers the ports of the first and second stages in said posterior wall, so that communication is made to the second stage by means of the front surface of its speaker cone.

7. The enclosure of claim 5 in which said second loudspeaker covers the ports of the first stage only, so that communication is made to the second stage by means of the back surface of its speaker cone.

8. The enclosure of claim 1, 2 or 3 in which said second sidewall is folded back coaxially upon said first sidewall and said third sidewall is folded back coaxially upon said second sidewall in such a manner that the interposed cross sectional area, made continuous by interconnecting ports, increases at an exponential rate.

9. The enclosure of claim 1, 2 or 3, in which one or more of said sidewalls have triangular cross section through at least part of their axial extent.

10. The enclosure of claim 3 in which said anterior wall is toroidal and in which one or more of said sidewalls taper at an exponentially increasing rate.

* * * * *